(12) United States Patent  
Miyao

(10) Patent No.: US 7,696,531 B2
(45) Date of Patent: Apr. 13, 2010

(54) SEMICONDUCTOR DEVICE AND MANUFACTURING METHOD THEREOF

(75) Inventor: Akio Miyao, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 51 days.

(21) Appl. No.: 11/338,715

(22) Filed: Jan. 25, 2006

(65) Prior Publication Data

US 2006/0202246 A1  Sep. 14, 2006

(30) Foreign Application Priority Data

Mar. 10, 2005 (JP) ............................. 2005-067535

(51) Int. Cl.
*H01L 29/74* (2006.01)
*H01L 21/4763* (2006.01)

(52) U.S. Cl. ........................... 257/155; 257/E29.041; 438/619

(58) Field of Classification Search ............... 257/155, 257/E29.041; 438/619
See application file for complete search history.

(56) References Cited

U.S. PATENT DOCUMENTS 5,273,933 A * 12/1993 Hatano et al. ................. 117/89
5,362,979 A * 11/1994 Merchant ..................... 257/340
6,806,181 B2 * 10/2004 Sakamoto ..................... 438/619

FOREIGN PATENT DOCUMENTS

JP  2001-144106   5/2001
JP  2001-230263 * 5/2001

OTHER PUBLICATIONS

Machine translation of Detaled Description of JP-2001-230263, 10 pages.*
Official translation of JP-2001230263.*

* cited by examiner

*Primary Examiner*—Bradley K Smith
*Assistant Examiner*—Alexander Belousov
(74) *Attorney, Agent, or Firm*—Oblon, Spivak, McClelland, Maier & Neustadt, L.L.P.

(57) ABSTRACT

A semiconductor device includes: an channel layer formed on a semiconductor substrate; a drain electrode and a source electrode both formed on the channel layer apart from each other; a surface passivation film formed on the channel layer so as to cover the channel layer except for the drain electrode and the source electrode; a gate electrode disposed between the drain electrode and the source electrode so as to penetrate the surface passivation film; a field plate electrode provided on the surface passivation film between the drain electrode and the gate electrode at a predetermined distance from the gate electrode; and a connecting plate having a bridge structure connecting the gate electrode to the field plate electrode. The bridge structure may be formed with at least one opening penetrating the connecting plate so as to face the surface passivation film with a predetermined space.

16 Claims, 7 Drawing Sheets

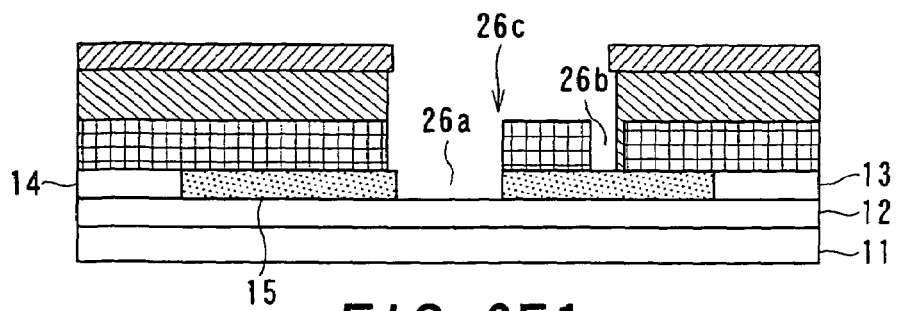
FIG. 3E1
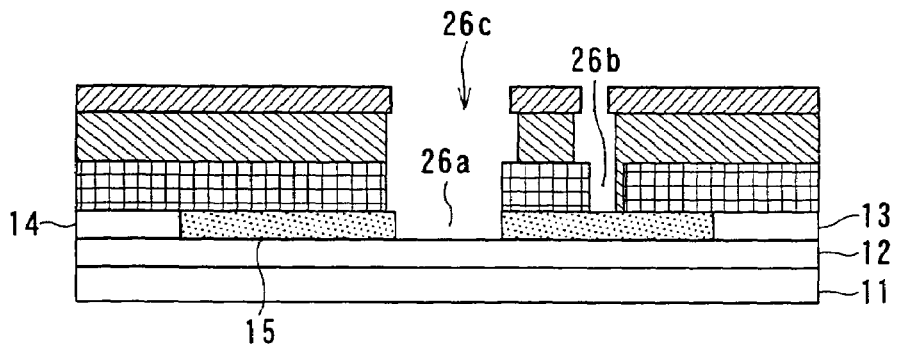
FIG. 3E2
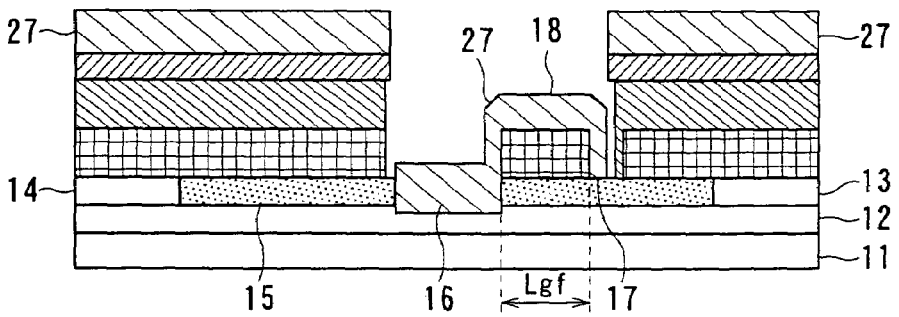
FIG. 3F1
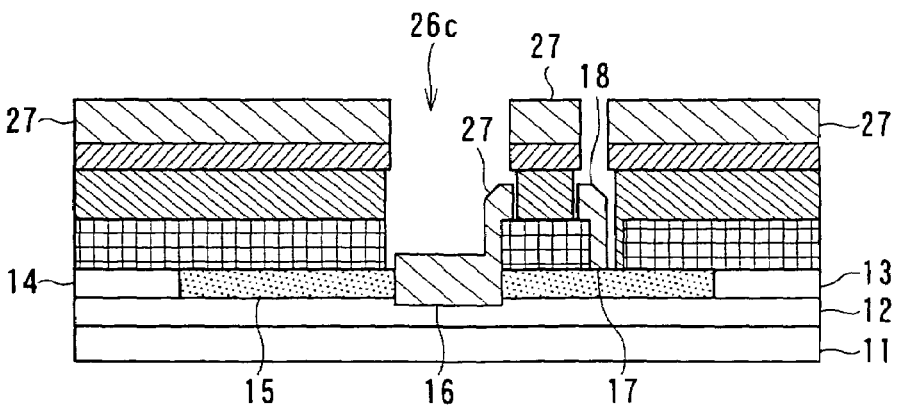
FIG. 3F2

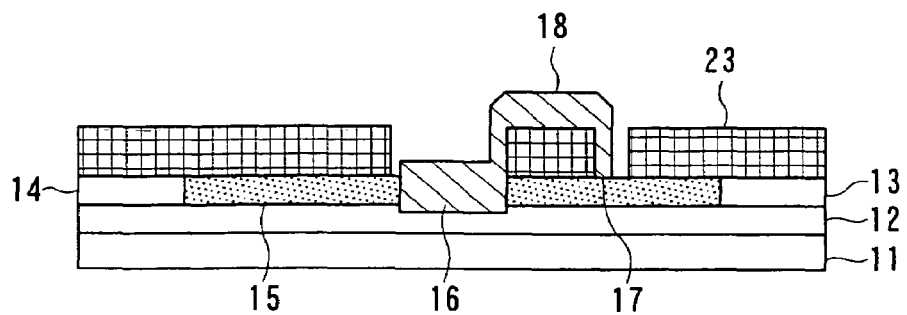
FIG. 4G1
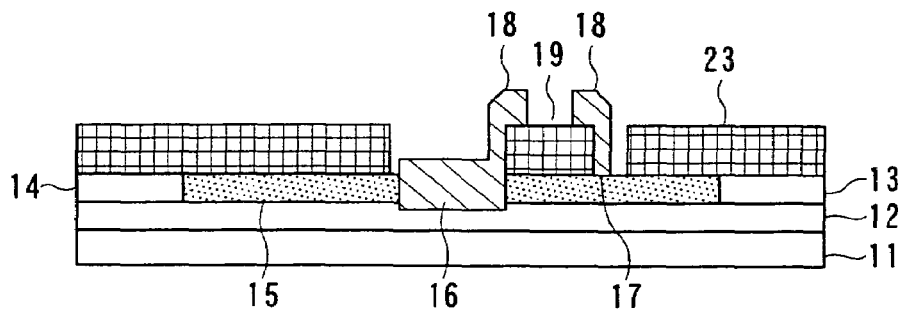
FIG. 4G2
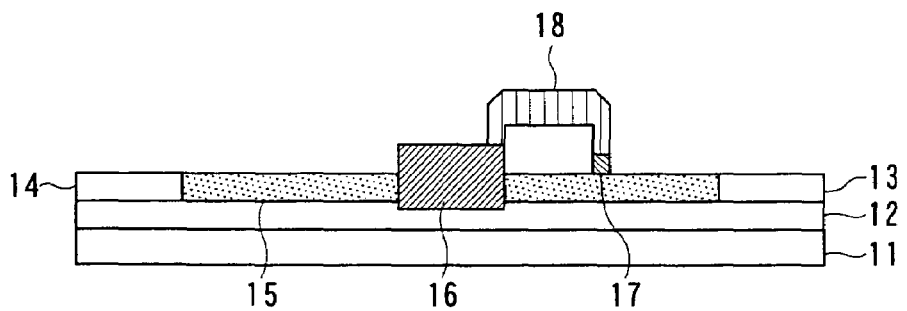
FIG. 4H1
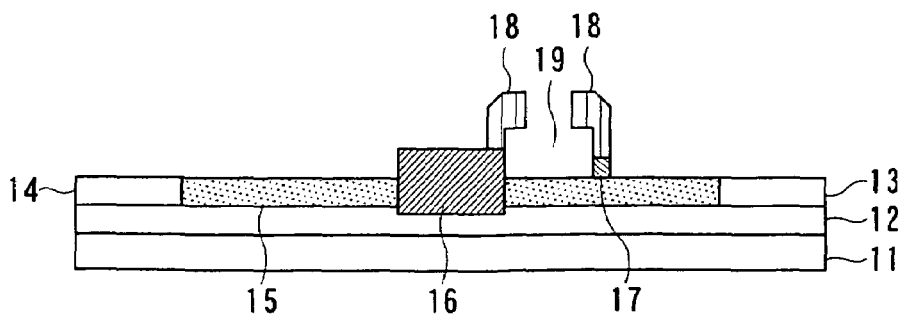
FIG. 4H2

SEMICONDUCTOR DEVICE AND MANUFACTURING METHOD THEREOF

CROSS REFERENCE TO RELATED APPLICATION

This application is based upon and claims the benefit of priority from prior Japanese Patent Application No. 2005-067535 filed on Mar. 10, 2005, the entire contents of which are incorporated herein by reference.

BACKGROUND OF THE INVENTION

1. Field of the Invention

The present invention relates to a semiconductor device having, particularly, an improved arrangement of a filed plate electrode (Fet), and a manufacturing method thereof.

2. Related Art

It has been well known that when a field plate electrode is provided for a semiconductor device, such as a field effect transistor, and is connected to the gate electrode thereof, the breakdown voltage of the semiconductor device can be improved.

FIG. 7 is a schematic perspective view showing one example of a conventional semiconductor device having a field plate electrode, and a semiconductor device 50 shown in FIG. 7 is, for example, a GaAs field effect transistor. A channel layer 52 is formed in the vicinity of a surface of a semiconductor substrate 51, and on this channel layer 52, a drain electrode 53 and a source electrode 54, each having an ohmic contact, and a gate electrode 55 having a Schottky contact are formed.

In addition, on the surface of the channel layer 52 between the drain electrode 53 and the source electrode 54, a surface passivation film (surface protective film) 56 composed, for example, of silicon nitride (SiN) is formed so as to cover the gate electrode 55, and furthermore, on the surface passivation film 56 between the drain electrode 53 and the gate electrode 55, a field plate electrode 57 is formed at a predetermined distance Lgf from the gate electrode 55.

Next, one example of a manufacturing method of the above semiconductor device 50 will be described. First, the drain electrode 53 and the source electrode 54, each having an ohmic contact, are formed on the channel layer 52 formed on the surface of the semiconductor substrate 51. Subsequently, a resist pattern having an opening for forming the gate electrode is formed on the surface of the channel layer 52 using a photolithographic technique or the like, and a metal film is formed over the entire surface thereof. The metal film other than that for forming the gate electrode 55 is thereafter removed by a lift-off method together with the resist film, thus the gate electrode 55 being formed.

Then, an SiN film used as the surface passivation film 56 is formed by, for example, a plasma CVD method over the entire surface of the channel layer 52 between the drain electrode 53 and the source electrode 54. Subsequently, after a resist pattern having an opening for forming the field plate electrode 57 has been formed on the surface passivation film 56, and a metal film has been then formed, the metal film other than that in the opening is removed by a lift-off method together with the resist film, thus the field plate electrode 57 being formed.

As a method for connecting the gate electrode 55 to the field plate electrode 57, the following example may be mentioned.

For example, there may be provided a method in which a connection pattern used for connection is formed on the surface passivation film 56. In this method, after a predetermined portion of the surface passivation film 56 covering the gate electrode 55 is removed by chemical dry etching or the like, the field plate electrode 57 and the above predetermined portion of the exposed gate electrode 55 are connected to each other by the connection pattern (not shown in FIG. 7) formed on the surface passivation film 56.

In addition, there is also provided an example, in which the connection is performed outside of the semiconductor device 50, as disclosed, for example, in Japanese Patent Laid-open Publication No. 2000-315804. In this example, unit filed effect transistors are disposed in series, in each of which a gate electrode and a field plate electrode are formed with a predetermined distance therebetween, so that a high output device is formed, and the gate electrode and the field plate electrode of each field effect transistor (FET) are connected to each other by way of a connection portion provided outside.

Furthermore, unlike the above structure in which the gate electrode and the field plate electrode are disposed separately, there may be further provided an example in which the gate electrode and the field plate electrode are integrated, for example, as disclosed in Japanese Patent Laid-open Publication No. 2001-230263. In this example, a field plate section having a portion protruding from the gate electrode toward the drain electrode side is formed, and a high dielectric material is disposed between the field plate section and the channel layer.

When the field plate electrode 57 connected to the gate electrode 55 is disposed, the breakdown voltage of the semiconductor device 50 such as a field effect transistor is improved. In the structure in which the gate electrode 55 and the field plate electrode 57 are formed with a predetermined distance Lgf provided therebetween as shown in FIG. 5, the breakdown voltage characteristic varies depending on the distance Lgf. Hence, in order to obtain desired breakdown voltage characteristic, it is necessary to reduce an error of the distance Lgf and to form the gate electrode 55 and the field plate electrode 57 with high precision at predetermined positions.

However, in the above conventional manufacturing method, since the gate electrode 55 and the field plate electrode 57 are formed in different steps, it has been difficult to highly precisely maintain the distance Lgf between the gate electrode 55 and the field plate electrode 57. As a result, the breakdown voltage characteristic varies, and hence, the manufacturing yield of the semiconductor device 50 is decreased.

In addition, when the field plate electrode 57 is provided, a parasitic capacitance is generated between the field plate electrode 57 and the channel layer 52. In particular, as is the method disclosed in the Japanese Patent Laid-open Publication No. 2001-230263, when the gate electrode and the field plate electrode are integrated, the parasitic capacitance is increased. This parasitic capacitance acts as a feedback capacitance to the gate electrode 55 used as a signal input side, and hence, high frequency characteristic of the semiconductor device is adversely influenced such that input/output characteristic of the semiconductor device in a high frequency region are degraded.

SUMMARY OF THE INVENTION

The present invention was therefore conceived in consideration of the circumstances encountered in the related art mentioned above, and an object of the present invention is to provide a semiconductor device having an improved field plate electrode structure and having a superior high frequency characteristic or performance, and also provide a method for manufacturing the same with improved yield.

This and other objects can be achieved according to the present invention by providing, in one aspect, a semiconductor device comprising: a semiconductor substrate; a channel layer provided on one surface of the semiconductor substrate; a drain electrode formed on the channel layer; a source electrode formed on the channel layer apart from the drain electrode; a surface passivation film formed on the channel layer so as to cover the channel layer except for portions on which drain electrode and the source electrode are formed; a gate electrode disposed between the drain electrode and the source electrode so as to penetrate the surface passivation film to provide a Schottky contact to the channel layer; a field plate electrode provided on the surface passivation film between the drain electrode and the gate electrode at a predetermined distance from the gate electrode; and a connecting plate having a bridge structure connecting the gate electrode to the field plate electrode.

In the above aspect, the connecting plate may be formed with at least one opening penetrating the connecting plate so as to face the surface passivation film with a predetermined space. The connecting plate may have a length reduced in a longitudinal direction of the field plate electrode.

Furthermore, it may be desired that the surface passivation film is formed of a silicon nitride (SiN) film or a silicon oxide (SiO$_2$) film.

In another aspect of the present invention, there is provided a method for manufacturing a semiconductor device, comprising the steps of: preparing a semiconductor substrate having one surface on which a channel layer is formed; forming a drain electrode on the channel layer and forming a source electrode on the channel layer apart from the drain electrode; depositing a surface passivation film on the surface of the channel layer except for portions on which the drain electrode and the source electrode are formed; coating a photoresist onto the drain electrode, the source electrode and the surface passivation film to form a photoresist film; forming an opening to the surface passivation film so as to penetrate the photoresist film for forming a gate electrode; removing the photoresist film and coating or depositing an insulating film over the entire surface exposed after the photoresist film is removed; forming an opening in the insulating film for forming the gate electrode and an opening for forming the field plate electrode; forming a photoresist layer over the entire surface of the insulating film; forming openings in the photoresist layer respectively for forming the gate electrode and the field plate electrode, and forming a connecting plate; forming a metal film over the entire surface of the photoresist layer including the openings for forming the gate electrode, the field plate electrode, and the connecting plate; removing the photoresist layer and the metal film except for the gate electrode, the field plate electrode, and the connecting plate; and removing the insulating film formed between the connecting plate and the surface passivation film.

In a preferred example of this aspect, it is desirable that the connecting plate is formed with at least one of opening penetrating vertically the connecting plate so as to face the surface passivation film at a predetermined space.

The surface passivation film may be a silicon nitride (SiN) film, and the insulating film is a photosensitive organic film, or the surface passivation film may be a silicon oxide (SiO$_2$) film, and the insulating film is a silicon nitride (SiN) film.

According to the present invention of the aspects mentioned above, a semiconductor device incorporating a field plate electrode and having high frequency characteristic can be obtained, and in addition, the method for manufacturing the same can be also provided with improved manufacturing yield.

The nature and further characteristic features of the present invention will be made more clear from the following descriptions made with reference to the accompanying drawings.

BRIEF DESCRIPTION OF THE DRAWINGS

In the accompanying drawings:

FIGS. 3E1, 3E2 and 3F1, 3F2 are views illustrating a second stage of the manufacturing method of a semiconductor device according to the one embodiment;

FIGS. 4G1, 4G2 and 4H1, 4H2 are views illustrating a third stage of the manufacturing method of a semiconductor device according to the one embodiment;

DESCRIPTION OF THE PREFERRED EMBODIMENTS

Hereinafter, a preferable embodiment of a semiconductor device according to the present invention and an embodiment of a manufacturing method thereof will be described with reference to the accompanying drawings, in which it is to be noted that terms such as "upper", "lower" and the like terms are generally used herein with reference to the illustration on the accompanying drawings.

Embodiment 1

Figure 1:
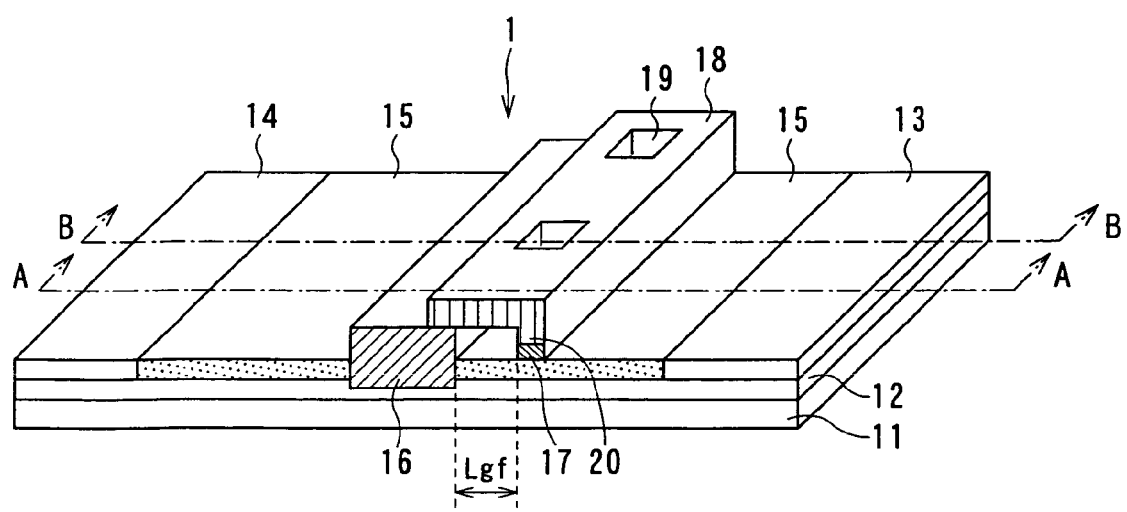
FIG. 1 is a schematic perspective view showing a semiconductor device according to one embodiment of the present invention.

FIG. 1 is a schematic perspective view showing a semiconductor device according to one embodiment of the present invention. In a semiconductor device 1 shown in FIG. 1, a semiconductor substrate 11 is formed, for example, of GaAs, and on this semiconductor substrate 11, an channel layer 12 is formed. A drain electrode 13 and a source electrode 14 are formed on this channel layer 12 at portions apart from each other, and a gate electrode 16 is formed between the drain electrode 13 and the source electrode 14. In addition, a surface passivation film 15 is further formed on the channel layer 12 except for portions on which the drain electrode, 13, the source electrode 14 and the gate electrode 16 are formed.

Furthermore, a field plate electrode 17 is formed on the surface passivation film 15 between the gate electrode 16 and the drain electrode 13, at a predetermined distance Lgf from the gate electrode 16, the distance Lgf being a distance between inside surfaces thereof facing each other.

The field plate electrode 17 and the gate electrode 16 are connected to each other with or by way of an electrically connecting plate or conducting plate 18 provided therebetween. The connecting plate 18 is formed with an opening as a window 19, usually, a plurality of openings (windows) 19, so as to penetrate the connecting plate in a vertical direction and face the surface passivation film 15 with a predetermined space therebetween. As shown in FIG. 1, the gate electrode 16 and the field plate electrode 17 are electrically connected through the connecting plate 18 so as to provide a bridge structure, in which the connecting plate 18 has one edge side mounted on the gate electrode and the other end, i.e. a leg portion, 20 mounted on the field plate electrode.

According to the structure of the semiconductor device mentioned above, the filed electrode 17 is disposed on the surface passivation film 15 arranged between the gate electrode 16 and the drain electrode 13 at a predetermined distance Lgf from the gate electrode 16, and hence, the breakdown voltage characteristic can be improved. In addition, since the gate electrode 16 and the field plate electrode 17 are connected to each other with the bridge-shaped connecting plate 18 (which may be so-called "air-bridge") apart from the surface passivation film 15 with the predetermined space therefrom, unnecessary capacitance between the connecting plate 18 and the channel layer 12 is not increased, and adverse effect due to such capacitance can be minimized, thus effectively providing superior frequency characteristic or performance.

Further, in the above arrangement, the number of the opening 19 is not limited, and generally, a suitable number of openings 19 may be formed in consideration of resistance of the connecting plate 18 to be less than a prescribed value.

Hereunder, a method for manufacturing the semiconductor device 1 shown in FIG. 1 will be described with reference to FIGS. 1 to 4, in which FIGS. 2A to 2D, FIGS. 3E1 to 3F2 and FIGS. 4G1 to 4H2 are cross-sectional views of the semiconductor device in the first, second and third manufacturing stages, respectively, according to one embodiment of the present invention. The views on the respective stages are sequentially shown in accordance with the order of manufacturing steps.

Figure 2A:
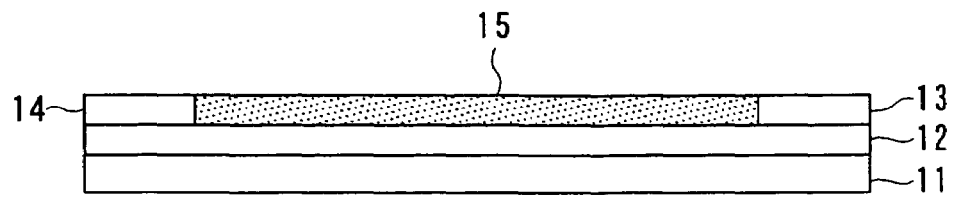
FIGS. 2A to 2D are views illustrating a first stage of a manufacturing method of a semiconductor device according to one embodiment of the present invention.

First, as shown in FIG. 2A, the drain electrode 13 and the source electrode 14 are formed on the channel layer 12 formed on the semiconductor substrate 11 so as to be apart from each other. The surface passivation film 15 is then formed on the surface of the channel layer 12 except for the formation of the drain electrode 13 and the source electrode 14. In this embodiment, the surface passivation film 15 is a silicon nitride (SiN) film formed by plasma chemical vapor deposition (CVD) method.

Figure 2B:
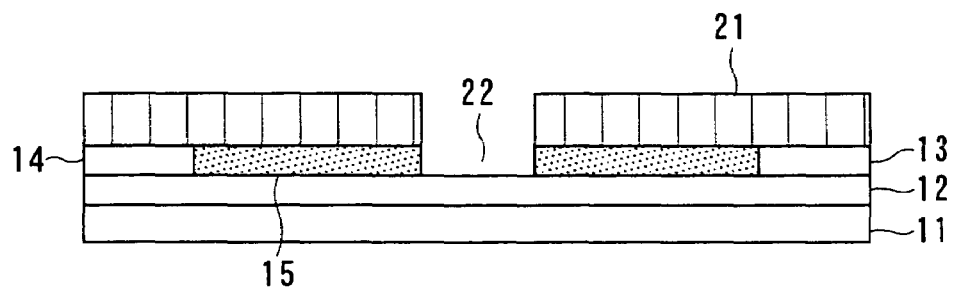

Next, as shown in FIG. 2B, a photoresist film 21 is formed through a coating process on the drain electrode 13, the source electrode 14, and the surface passivation film 15, which are provided above the semiconductor substrate 11, and a resist pattern having an opening for forming the gate electrode 16 is then formed by a photolithographic technique or the like. Subsequently, the surface passivation film 15 is removed through this opening through a reactive dry etching process or the like, so that an opening 22 for forming the gate electrode 16 is provided.

Figure 2C:
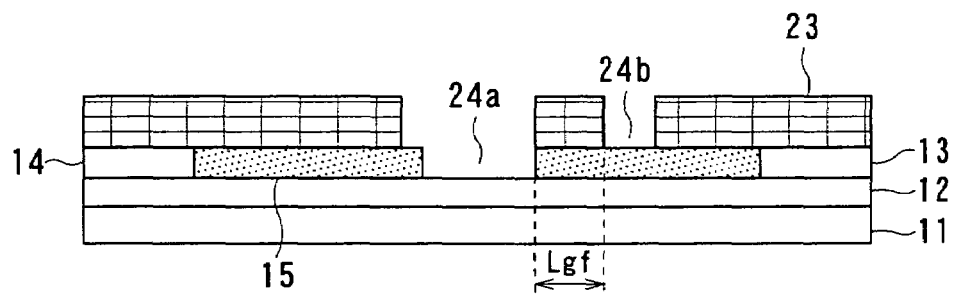

Next, as shown in FIG. 2C, after the photoresist film 21 formed by the coating process has been removed with an organic solvent or the like, an insulating film 23 is deposited over the entire surface. In this embodiment, the insulating film 23 is a photosensitive organic film.

Then, by a photolithography or the like, an opening 24a for forming the gate electrode 16 and an opening 24b for forming the field plate electrode 17 are formed in the insulating film 23 with an unremoved insulating film portion having the predetermined length Lgf.

Figure 2D:
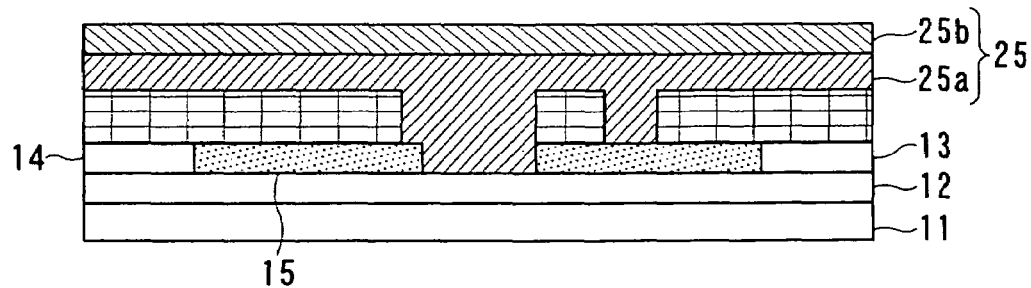

Subsequently, as shown in FIG. 2D, a photoresist layer 25 composed of a photoresist film 25a and a photoresist film 25b is formed over the entire surface including these two openings 24a and 24b. These two photoresist films 25a and 25b have different reaction rates with respect to a developing solution, and the reaction rate of the photoresist film 25a is set to be considerably faster than that of the photoresist film 25b.

Next, FIG. 3E1 is a cross-sectional view of the semiconductor device 1 taken along the line A-A shown in FIG. 1 passing through the connecting plate 18 at which the opening portion 19 is not provided, and FIG. 3E2 is a cross-sectional view of the semiconductor device 1 taken along the line B-B shown in FIG. 1 passing through the connecting plate 18 at which the opening portion 19 is provided. In FIG. 3E2, at a place 26c corresponding to the opening portion 19, the photoresist layer 25 remains. In addition, since the reaction rate with respect to a developing solution of the photoresist films 25a and that of the photoresist film 25b are different from each other, the photoresist layer 25 is etched to form openings each having an overhang shape.

In this stage, as shown in FIGS. 3E1 and 3E2, for example, by a photolithographic technique, an opening 26a for forming the gate electrode and an opening 26b for forming the field plate electrode are formed in the photoresist layer 25.

In the next, as shown in FIGS. 3F1 and 3F2, a metal film 27 is formed over the entire surface through a deposition process, in which FIG. 3F1 is a cross-sectional view of the semiconductor device 1 taken along the line A-A shown in FIG. 1, and FIG. 3F2 is a cross-sectional view of the semiconductor device 1 taken along the line B-B shown in FIG. 1.

The gate electrode 16 connected, through the Schottky contact, to the channel layer 12, the field plate electrode 17 formed on the surface passivation film 15 at a predetermined distance Lgf from the gate electrode 16, and the connecting plate 18 connecting between these two electrodes 16 and 17 are integrally formed in the same step by the deposition of the metal film 27. In addition, as shown in FIG. 3F2, an original pattern of the opening portion 19 of the connecting plate 18 is formed.

Subsequently, FIGS. 4G1 and 4G2 show the next stage, in which the photoresist layer 25 and the metal film 27 formed thereon are removed. That is, FIG. 4G1 is a cross-sectional view of the semiconductor device 1 taken along the line A-A shown in FIG. 1, and FIG. 4G2 is a cross-sectional view of the semiconductor device 1 taken along the line B-B shown in FIG. 1. As shown in FIG. 4G2, the opening portion 19 is formed in the connecting plate 18 in this stage.

Next, FIGS. 4H1 and 4H2 show the state that the insulating film 23 is removed by using an organic solvent or the like. That is, FIG. 4H1 is a cross-sectional view of the semiconductor device 1 taken along the line A-A shown in FIG. 1, and FIG. 4H2 is a cross-sectional view of the semiconductor device 1 taken along the line B-B shown in FIG. 1.

In this step, the insulating film 23 provided between the connecting plate 18 and the surface passivation film 15 is removed through the opening portion 19 shown in FIG. 4H2. After this removal, as shown in FIGS. 4H1 and 4H2, a space is formed between the connecting plate 18 and the surface passivation film 15, thus providing a bridge-shaped structure connecting the gate electrode 16 and the field plate electrode 17. Thus, the semiconductor device 1 shown in FIG. 1 is completed.

Further, although in the embodiment shown in FIG. 1, two openings 19 are formed, one or more than two openings 19 or no opening may be formed as occasion demands as shown in FIG. 5, mentioned hereinafter, and moreover, the connecting plate 18 may have various bridge shape as far as the distance Lgf could be suitably maintained, as mentioned hereinafter with reference to FIG. 6.

In the manufacturing method described above, although the silicon nitride (SiN) film is used as the surface passivation film 15, a silicon oxide (SiO$_2$) film may be substituted therefor. In addition, although the photosensitive organic film is used as the insulating film 23, a silicon nitride (SiN) film may substituted therefor. In the case described above, in the steps shown in FIGS. 4H1 and 4H2, the insulating film 23 formed of silicon nitride will be removed by a chemical dry etching or the like process.

As described hereinbefore, according to the semiconductor device 1 of the present invention, since the field plate electrode 17 is provided on the surface passivation film 15 between the gate electrode 16 and the drain electrode 13, at the predetermined distance Lgf from the gate electrode 16, the breakdown voltage performance of the device can be improved. In addition, since the gate electrode 16 and the field plate electrode 17 are connected to each other by way of the connecting plate 18 having a bridge shape, unnecessary capacitance between the connecting plate 18 and the channel layer 12, which acts as feedback capacitance in the device, is not increased, and as a result, the superior high frequency performance and high output performance can be obtained.

In addition, according to the manufacturing method of the present invention, the gate electrode 16, the field plate electrode 17, and the connecting plate 18 connecting therebetween are integrally formed in the same step. Therefore, the distance Lgf between the gate electrode 16 and the field plate electrode 17 can be very precisely formed, and accordingly, the variation in breakdown voltage of the semiconductor device can be reduced, and in addition, the manufacturing yield thereof can be improved. Moreover, the number of the manufacturing steps can also be reduced.

Furthermore, the opening portions 19 are formed to the connecting plate 18 and the insulating film 23 formed under the bridge-shaped connecting plate, so that the insulating film below the connecting plate can removed through the opening portions 19. As a result, the increase in unnecessary capacitance between the channel layer 12 and the connecting plate 18 can be suppressed, and hence, a semiconductor device having superior high frequency performance can be provided.

Further, in the case where the silicon oxide (SiO$_2$) film is used as the surface passivation film 15 instead of the silicon nitride (SiN) film, the effects similar to that described above may be also obtained.

It is further to be noted that the present invention is not limited to the described embodiment and many other changes and modifications may be made without departing from the scopes of the appended claims.

For example, FIG. 5 shows other examples of the structure of the connecting plate 18.

Figure 5A:
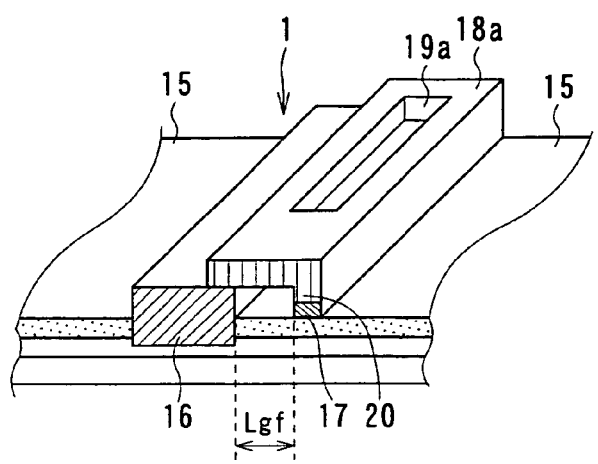
FIGS. 5A to 5C show other examples of a connecting plate of the semiconductor device of the present invention.

That is, FIG. 5A shows a semiconductor device 1 provided with one example of the connecting plate 18a having one large opening 19a. As mentioned hereinbefore, although the semiconductor device 1 of the present invention is provided with the connecting plate 18 having a plurality of openings 18 as shown in FIG. 1, the openings 19 may be substituted with one large opening 19a. The opening 19 is generally formed for the purpose of removing the insulating film 23 below the connecting plate 18, and accordingly, in this example, a possibly large dimension of the opening 19a is required as far as the connecting plate 18a has a resistance below a prescribed value.

Figure 5B:
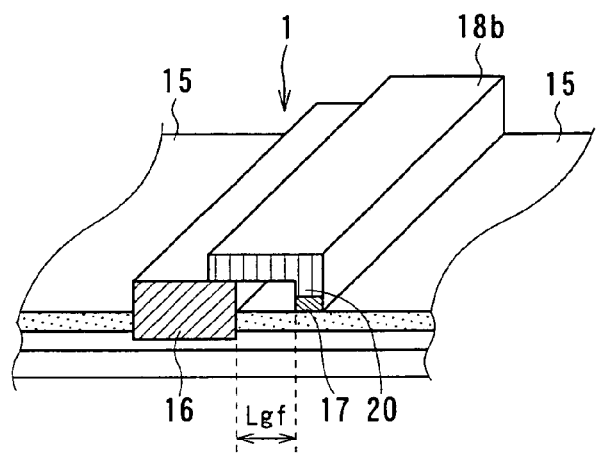
Figure 5C:
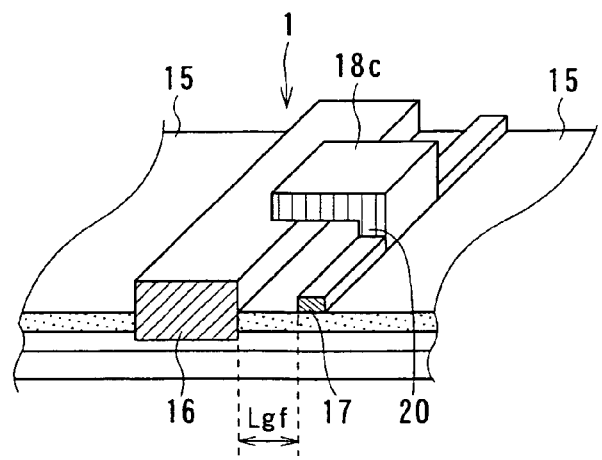

Moreover, as shown in FIG. 5B, the connecting plate 18b may otherwise be provided with no opening as far as the insulating film 23 is removable, and in addition, as shown in FIG. 5C, the connecting plate 18b may be reduced in dimensions in its depth direction (longitudinal direction of the field plate electrode 17) as far as the connecting plate 18c maintains a resistance below the prescribed value.

Furthermore, the connecting plate 18, the gate electrode 16 and the field plate electrode 17 may have other arrangements as shown in FIG. 6.

Figure 6A:
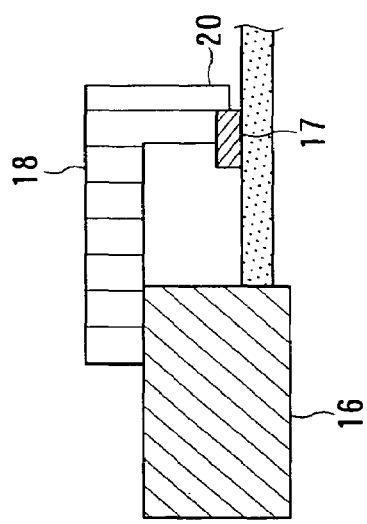
FIGS. 6A to 6E show other examples of an arrangement between the connecting plate, a gate electrode and a field electrode constituting the semiconductor device of the present invention.
Figure 6B:
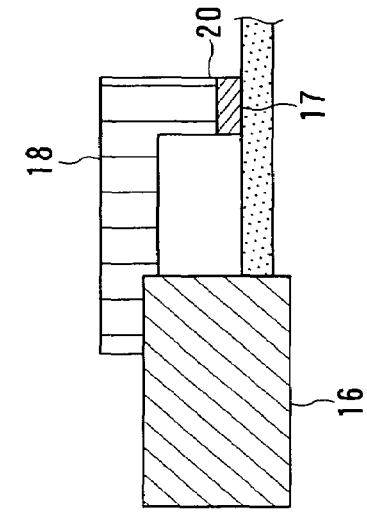
Figure 6C:
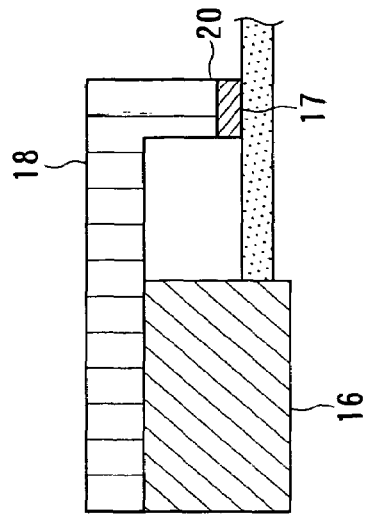
Figure 6D:
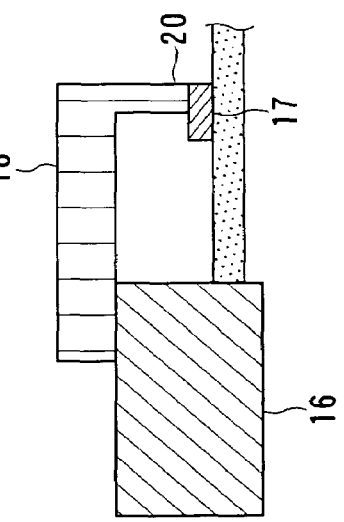
Figure 6E:
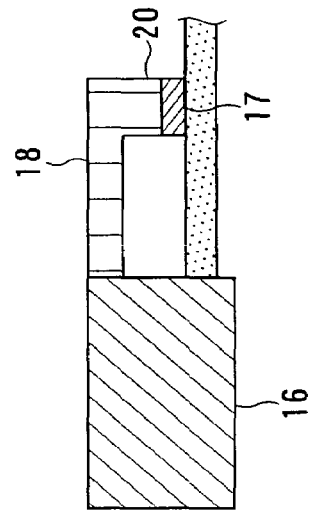
Figure 7:
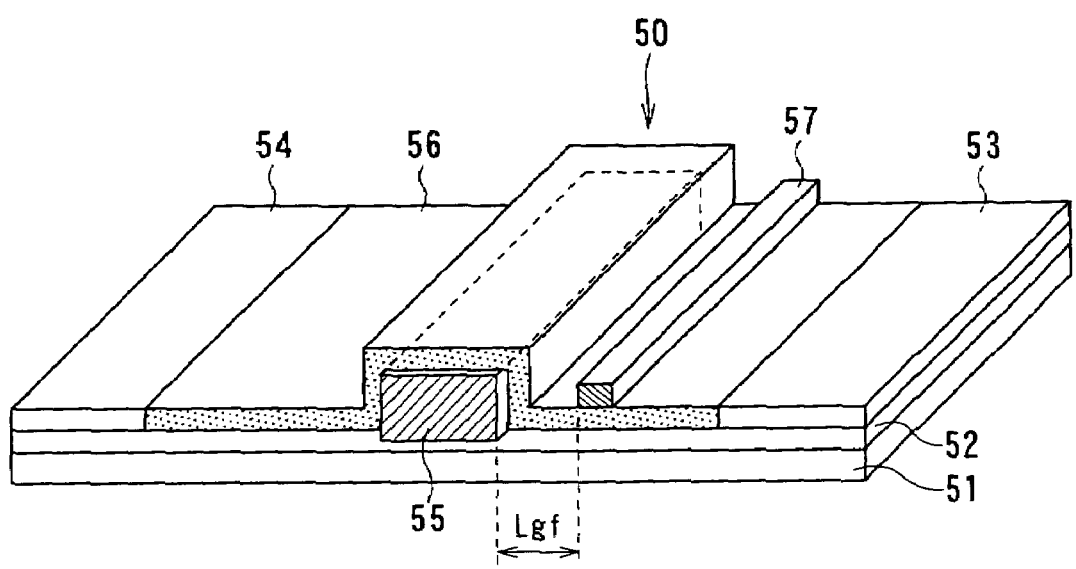
FIG. 7 is a schematic perspective view showing one example of a conventional semiconductor device having a field plate electrode.

FIG. 6A shows an example in which a leg portion 20 of the connecting plate 18 is shifted slightly outward with the predetermined distance Lgf being kept, and that is, the leg portion 20 is formed so as to be partially mounted on the filed plate electrode 17. FIG. 6B shows another example in which the connecting plate has a staged portion at one edge side so as to be mounted to the gate electrode 16. FIG. 6C shows a further example in which the one edge side of the connecting plate is mounted on the gate electrode 16 from one end edge to the other end edge in its width direction. FIG. 6D shows a still further example in which the leg portion 20 is made slender on the field plate electrode 17. FIG. 6E shows a still further example in which the connecting plate 18 is mounted to the side portion of the gate electrode 17 at one edge side. Further, the connecting plate 18, the gate electrode 16 and the field plate electrode 17 may have other arrangement more than the above even in combination thereof.

What is claimed is:

1. A semiconductor device comprising:
a semiconductor substrate;
a channel layer provided on one surface of the semiconductor substrate;
a drain electrode formed on the channel layer;
a source electrode formed on the channel layer at a portion apart from the drain electrode;
a surface passivation film formed on the channel layer so as to cover the channel layer except for portions on which drain electrode and the source electrode are formed;
a gate electrode disposed between the drain electrode and the source electrode so as to penetrate the surface passivation film to provide a Schottky contact to the channel layer;
a connecting plate having a horizontally extending bridge structure extending from said gate electrode; and
a field plate electrode protruding vertically downwards from the connection plate towards the surface passivation film, a bottom surface of the protruding field plate electrode being in contact with the surface passivation film, the field plate electrode located between the drain electrode and the gate electrode at a predetermined distance from the gate electrode, wherein
the connecting plate electrically connects the gate electrode to the field plate electrode.

2. The semiconductor device according to claim 1, wherein said connecting plate is formed with at least one opening penetrating the connecting plate so as to face the surface passivation film with a predetermined space.

3. The semiconductor device according to claim 1, wherein said connecting plate has a length reduced in a longitudinal direction of the field plate electrode.

4. The semiconductor device according to claim 1, wherein said surface passivation film is formed of a silicon nitride (SiN) film.

5. The semiconductor device according to claim 1, wherein said surface passivation film is formed of a silicon oxide (SiO$_2$) film.

6. The semiconductor device according to claim 1, wherein the field plate electrode and the gate electrode are arranged in parallel to each other, and are separated form each other by a predetermined distance.

7. The semiconductor device according to claim 1, wherein the connecting plate is arranged at a distance from an upper surface of the surface passivation film.

8. The semiconductor device according to claim 1, wherein the connecting plate and the field plate electrode form a L-shaped cross-section, with the connecting plate arranged in parallel to the substrate, and the field plate electrode protruding downwards from the connecting plate to be in contact with the surface passivation film.

9. The semiconductor device according to claim 8, wherein a lower surface of the connecting plate is in contact with an upper surface of the gate electrode.

10. The semiconductor device according to claim 1, wherein the connecting plate includes a leg portion that is laterally shifted outwardly with respect to a location of the field electrode plate.

11. The semiconductor device according to claim 1, wherein the connecting plate includes a staged portion at one end that is mounted to and in contact with both a vertical lateral surface and a horizontal upper surface of the gate electrode.

12. The semiconductor device according to claim 1, wherein the connecting plate extends laterally over an entire width of a horizontal upper surface of the gate electrode.

13. The semiconductor device according to claim 1, wherein the connecting plate has a leg portion having a lateral width that is smaller than a lateral width of the gate electrode.

14. The semiconductor device according to claim 1, wherein the connecting plate is mounted at one end to a side wall of the gate electrode.

15. The semiconductor device according to claim 1, wherein said connecting plate is arranged so as not to be in contact with the surface passivation film.

16. The semiconductor device according to claim 1, wherein vertical lateral side walls of said protruding field plate electrode are not in contact with the surface passivation film.

* * * * *